(12) United States Patent
Chang et al.

(10) Patent No.: US 9,666,253 B2
(45) Date of Patent: May 30, 2017

(54) DUAL RAIL MEMORY, MEMORY MACRO AND ASSOCIATED HYBRID POWER SUPPLY METHOD

(71) Applicant: TAIWAN SEMICONDUCTOR MANUFACTURING COMPANY LTD., Hsinchu (TW)

(72) Inventors: Jonathan Tsung-Yung Chang, Hsinchu (TW); Chiting Cheng, Taichung (TW); Cheng Hung Lee, Hsinchu (TW); Hung-Jen Liao, Hsin-Chu (TW); Michael Clinton, Austin, TX (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/924,069

(22) Filed: Oct. 27, 2015

(65) Prior Publication Data
US 2017/0084317 A1    Mar. 23, 2017

Related U.S. Application Data

(60) Provisional application No. 62/220,546, filed on Sep. 18, 2015.

(51) Int. Cl.
*G11C 7/12*   (2006.01)
*G11C 5/14*   (2006.01)
(Continued)

(52) U.S. Cl.
CPC .................. *G11C 7/12* (2013.01); *G11C 5/14* (2013.01); *G11C 7/06* (2013.01); *G11C 7/10* (2013.01);
(Continued)

(58) Field of Classification Search
CPC ........................................................ G11C 7/12
(Continued)

(56) References Cited

U.S. PATENT DOCUMENTS

| 5,936,892 A | * | 8/1999 | Wendell | ................. | G11C 7/065 |
| | | | | | 365/156 |
| 6,191,990 B1 | * | 2/2001 | Itoh | ......................... | G11C 7/18 |
| | | | | | 257/E21.021 |

(Continued)

FOREIGN PATENT DOCUMENTS

KR    10-2012-0062824    6/2012

OTHER PUBLICATIONS

Office Action issued by the German Patent and Trade Mark Office dated Apr. 22, 2016.
(Continued)

*Primary Examiner* — Mushfique Siddique
(74) *Attorney, Agent, or Firm* — WPAT, P.C., Intellectual Property Attorneys; Anthony King (57) ABSTRACT

A dual rail memory operable at a first voltage and a second voltage, the dual rail memory includes: a memory array operates at the first voltage; a word line driver circuit configured to drive a word line of the memory array to the first voltage; a data path configured to transmit an input data signal or an output data signal; and a control circuit configured to generate control signals to the memory array, the word line driver circuit and the data path; wherein the data path and the control circuit are configured to operate at both the first and second voltages. Associated memory macro and method are also disclosed.

19 Claims, 9 Drawing Sheets

(51) Int. Cl.
  *G11C 7/10* (2006.01)
  *G11C 7/06* (2006.01)
  *G11C 7/22* (2006.01)
  *G11C 8/10* (2006.01)
  *G11C 8/06* (2006.01)
  *G11C 8/08* (2006.01)

(52) U.S. Cl.
  CPC .................. *G11C 7/22* (2013.01); *G11C 8/06* (2013.01); *G11C 8/08* (2013.01); *G11C 8/10* (2013.01)

(58) Field of Classification Search
  USPC ...................................... 365/189.02
  See application file for complete search history.

(56) References Cited

U.S. PATENT DOCUMENTS

| | | | | |
|---|---|---|---|---|
| 6,603,703 B2* | 8/2003 | Lines | ........................ | G11C 8/08 365/189.06 |
| 7,027,346 B2* | 4/2006 | Houston | .................. | G11C 7/12 365/189.09 |
| 7,558,145 B2* | 7/2009 | Rao | ........................ | G11C 11/413 365/154 |
| 8,570,791 B2* | 10/2013 | Liu | .......................... | G11C 8/08 365/154 |
| 8,605,534 B2 | 12/2013 | Lee et al. | | |
| 2005/0068811 A1* | 3/2005 | Cordoba | ................. | G11C 5/145 365/189.11 |
| 2005/0219903 A1 | 10/2005 | Daga | | |
| 2008/0279017 A1* | 11/2008 | Shimano | ................ | G11C 5/063 365/189.06 |
| 2011/0199846 A1* | 8/2011 | Tao | .......................... | G11C 8/10 365/203 |
| 2012/0033517 A1 | 2/2012 | Cheng et al. | | |
| 2013/6013594 | 3/2013 | Frinking et al. | | |
| 2013/0135946 A1* | 5/2013 | Katoch | ................ | G11C 11/4074 365/189.11 |
| 2014/0025981 A1 | 1/2014 | Evans et al. | | |
| 2015/0098267 A1 | 4/2015 | Jain et al. | | |
| 2015/0187402 A1* | 7/2015 | Chun | ........................ | G11C 8/08 365/230.02 |

OTHER PUBLICATIONS

Office Action issued by the Korean Intellectual Property Office dated Dec. 27, 2016 for corresponding Korean application No. 10-2016-0011649.
US8605534 corresponds to KR20120062824.
Office action and search report dated Mar. 9, 2017 from the Taiwan Intellectual Property Office for Taiwan application 105121881.

* cited by examiner

DUAL RAIL MEMORY, MEMORY MACRO AND ASSOCIATED HYBRID POWER SUPPLY METHOD

CROSS REFERENCE TO RELATED APPLICATIONS

This application claims the benefit of U.S. provisional application 62/220,546, filed on Sep. 18, 2015, which is incorporated by reference in its entirety.

BACKGROUND

Memory devices are subject to a phenomenon known as leakage power. Leakage power is typically dissipated by logic in the periphery and core memory arrays whenever the memory is powered on. As technology continues to shrink device features below sub-nanometer geometries, leakage power dissipation in a memory device increases. This leakage power is becoming a significant factor of the total power dissipation in memory.

One way to reduce leakage power is to reduce the power supply voltage for a memory device. However, the voltage level of a bit cell in the memory needs to be maintained at a minimum voltage specification for retention, while periphery sections of the memory device can operate below the specified voltage. As a result, dual rail memory power supplies have been developed where the periphery and core of a memory operate with different power supplies at different voltages, in an effort to reduce leakage power. Memories with dual rail memory power supplies use level shifters to isolate a high-voltage domain (e.g., VDDM) for one group of circuits from a low-voltage domain (e.g., VDD) for another group of circuits and convert signal voltages by the level shifters to an appropriate domain.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present invention will be described herein in the context of an exemplary hybrid dual rail memory power supply scheme for a memory. It is to be appreciated, however, that the invention is not limited to the specific circuits and systems illustratively shown and described herein. Rather, embodiments of the invention are directed broadly to techniques for beneficially integrating features of a hybrid dual rail memory power supply scheme in high-density memory, without regard for whether the memory is embedded or standalone. In this manner, embodiments of the invention provide a hybrid dual rail memory power supply scheme that can be beneficially used in a variety of memory arrangements and types, such as, for example, random access memory (RAM), static random access memory (SRAM), read-only memory (ROM), content addressable memory (CAM), flash memory, register files, and the like. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Figure 1:
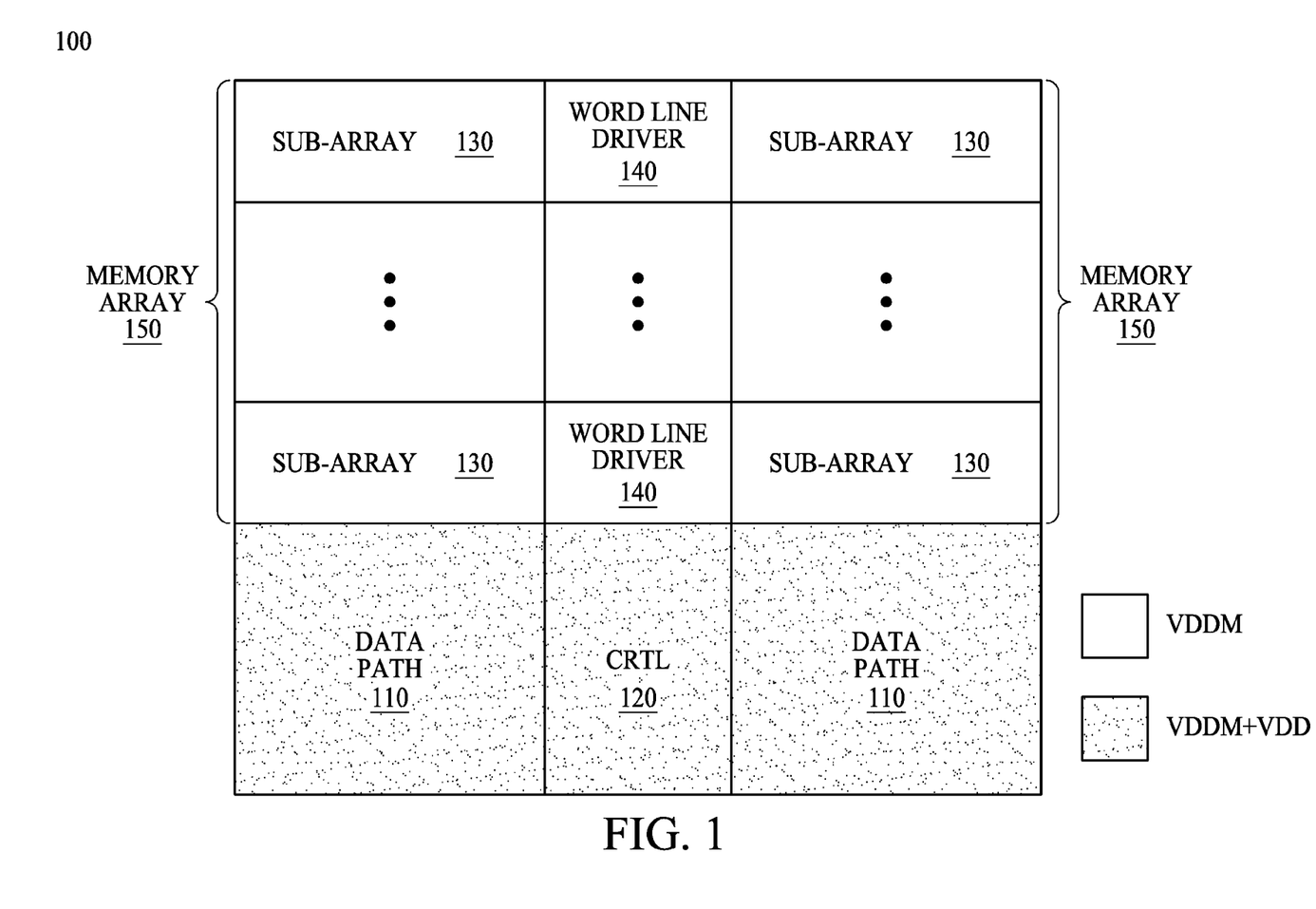
FIG. 1 is a block diagram conceptually illustrating a hybrid dual rail memory power supply scheme for a memory macro according to an exemplary embodiment of the present disclosure.

FIG. 1 is a block diagram conceptually illustrating a hybrid dual rail memory power supply scheme for a memory macro 100 according to an exemplary embodiment of the present disclosure. The memory macro 100 may be a static random access memory (SRAM), and may be situated in a computer or other electronic systems. Referring to FIG. 1, the memory macro 100 includes a plurality of memory arrays 150, typically two dimensional, of memory bit cells configured to store respective logic states, i.e., either a logic high (logical "1") or a logic low (logical "0"). The memory bit cells are often arranged in one or more parallel columns 130 (each a one dimensional sub-array 130).

In the exemplary embodiment, the memory macro 100 has a symmetrical structure. For example, the left side of the memory macro 100 has similar elements as the right side of the memory macro 100. The plurality of memory sub-arrays 130 as disposed in both of the left side and right side of the memory macro 100 are shown in FIG. 1. Two data paths 110 are also deployed in a symmetrical manner, one on the left side and one on the right side.

The data paths 110 include circuitry to transfer data between corresponding memory sub-arrays 130 and circuits outside of the memory macro 100. For example, in some embodiments, the data paths 110 include circuits to perform write mask operations, circuits to control column redundancy, circuits to encode and decode the error correction code (ECC), sense amplifier circuits for global bit lines, write driver circuits for global bit lines, etc. However, this is not a limitation of the present disclosure.

Word line driver circuits 140 located between the two symmetrical memory arrays 150 are utilized for driving a word line of the memory arrays 150 to a word line driving voltage of a specified voltage level. The control circuit 120 provides control signals for the plurality of sub-arrays 130 and the data paths 110 of the left and right side memory arrays 150. In some embodiments, the control circuit 120 generates control and timing signals for sense amplifiers used in sensing bit cells in the memory array 150. The control circuit 120 also includes circuits to select banks of memory cells, circuits to decode the word line and word line drivers, etc.

In this embodiment, a first power supply is employed having a first voltage, VDDM, and a second power supply is employed having a second voltage, VDD, that is lower than the first voltage VDDM. A power domain assignation of the first voltage VDDM and second voltage VDD are illustrated in FIG. 1. The memory macro 100 is structured so that the memory arrays 150 and the word line driver circuits 140 substantially operate at the first voltage VDDM, while the data paths 110 and the control circuit 120 are configured to operate at both the first voltage VDDM and the second voltage VDD. Specifically, a portion of the data paths 110 and a portion of the control circuit 120 are configured to operate at the first voltage VDDM; and a remaining portion of the data paths 110 and a remaining portion of the control circuit 120 are configured to operate at the lower second voltage VDD.

The hybrid dual rail memory power supply scheme of FIG. 1 has advantages in that a balanced performance on both speed and power consumption can be achieved, especially compared with existing interface level shifter dual rail memory and true dual rail memory power supply schemes. A dual rail memory macro is called the interface level shifter dual rail memory when the entire memory macro operates in a first voltage domain of a higher power supply than a second voltage domain outside the memory macro, wherein level shifters are disposed at a pin boundary of the memory macro. For a true dual rail memory power supply scheme, only memory arrays and a portion of word line driver of the memory macro operate at a first voltage, and the remaining circuits of the memory macro operate in another domain at a second voltage lower than the first voltage.

For simplicity, various circuits in each of the data paths 110, the control circuit 120, the memory array 150 and the word line driver circuits 140 are not shown in the block diagram. Details regarding the various circuits are provided in the following drawings and descriptions are in the following paragraphs. It will become apparent to those skilled in the art given the teachings herein that numerous modifications can be made to the embodiments shown that are within the scope of the present invention.

Figure 2:
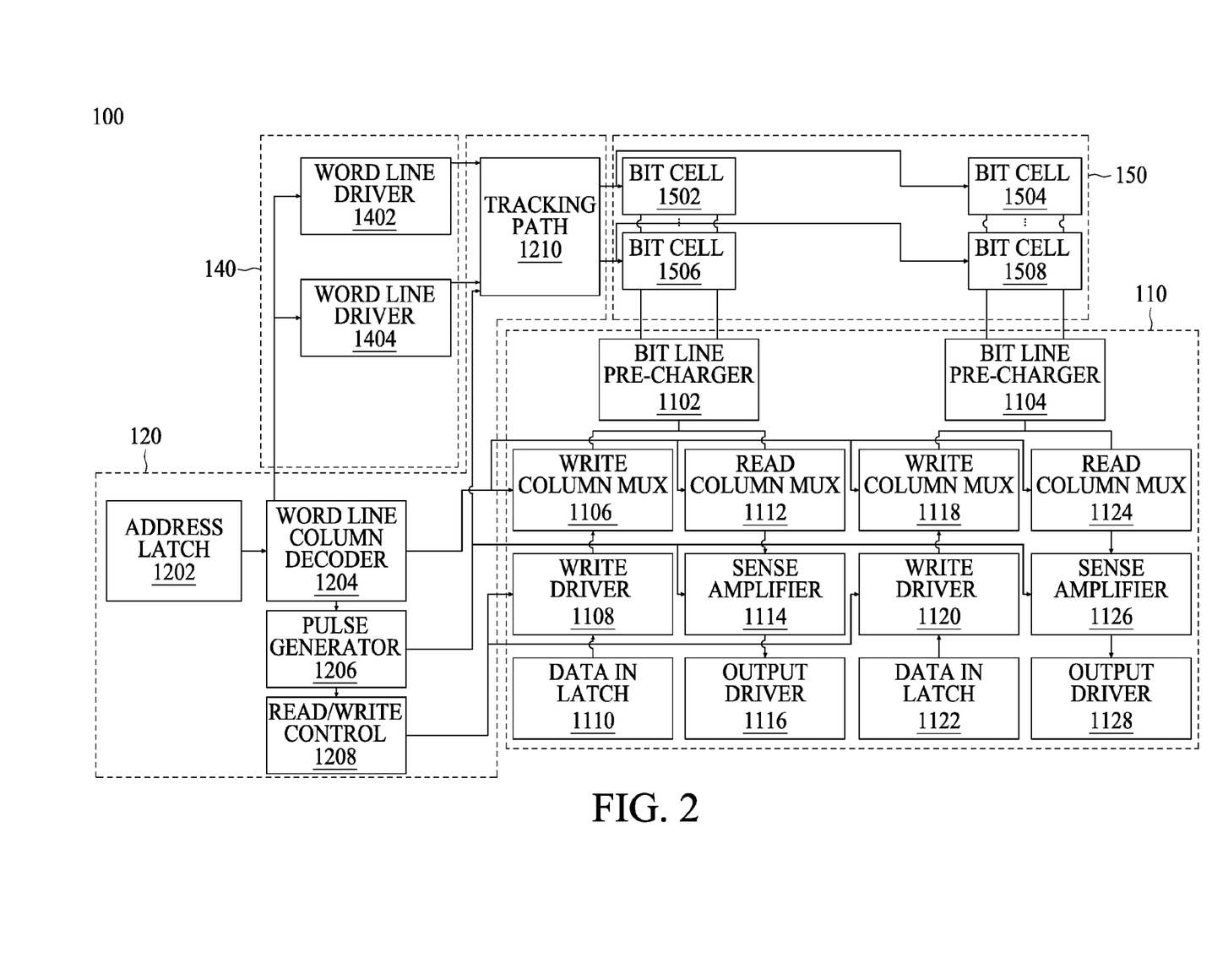
FIG. 2 is a more detailed schematic diagram illustrating the memory macro of FIG. 1 according to an exemplary embodiment of the present disclosure.

FIG. 2 is a more detailed schematic diagram illustrating the memory macro 100 of FIG. 1 according to an exemplary embodiment of the present disclosure. With respect to the FIG. 1, like elements in FIG. 2 are designated with the same reference numbers for ease of understanding. At the upper right side of FIG. 2, the memory array 150 includes a plurality of bit cells 1502-1508, which are depicted for illustrative purpose only. As mentioned above, the entire memory array 150 operates at the first voltage VDDM higher than the second voltage VDD in order to reduce occurrence of errors during read/write operations. In addition, the reduction in power supply voltage of the memory array 150 can cause the memory array 150 more susceptible to soft error rate effects. Soft error rate is a measure of the ability of each bit cell to maintain a data state in the presence of environmental noise such as alpha (α) particles. Alpha particles are a form of radiation energy commonly found in the environment. Alpha particles are very high energy particles that are very capable of penetrating many objects in the environment.

At the lower left side of FIG. 2, the control circuit 120 comprises an address latch 1202, a word line column decoder 1204, a pulse generator 1206, a read/write control 1208 and a tracking path 1210. The control inputs of the control circuit 120 may include, for example, addresses, read/write enable and chip select enable. The address latch 1202, the word line column decoder 1204, the read/write control 1208 and the pulse generator 1206 operate at the first voltage VDDM. The tracking path 1210 operates at both the first voltage VDDM and the second voltage VDD. Input level shifters (not shown in FIG. 2) are located in front of the address latch 1202 latching the control inputs, and transfer the control inputs from a peripheral voltage (e.g. the second voltage VDD) external to the memory macro 100 to the first voltage VDDM. As such, access time of the memory array 150 is not affected. By comparison, in the existing interface level shifter dual rail memory power supply scheme, word line level shifters are located after address latches, memory access time is adversely affected due to level shifter delay.

The word line column decoder 1204 serves as an interface for a particular column of the memory array 150. The pulse generator 1206 generates a pulse having a pulse width. The width of the pulse is selected so that the voltage level of a specified bit cell in the memory array 150 is reduced for a period of time that is sufficient for the data value to be written to that bit cell, while still being short enough to avoid other bit cells in the column becoming unstable.

Figure 3:
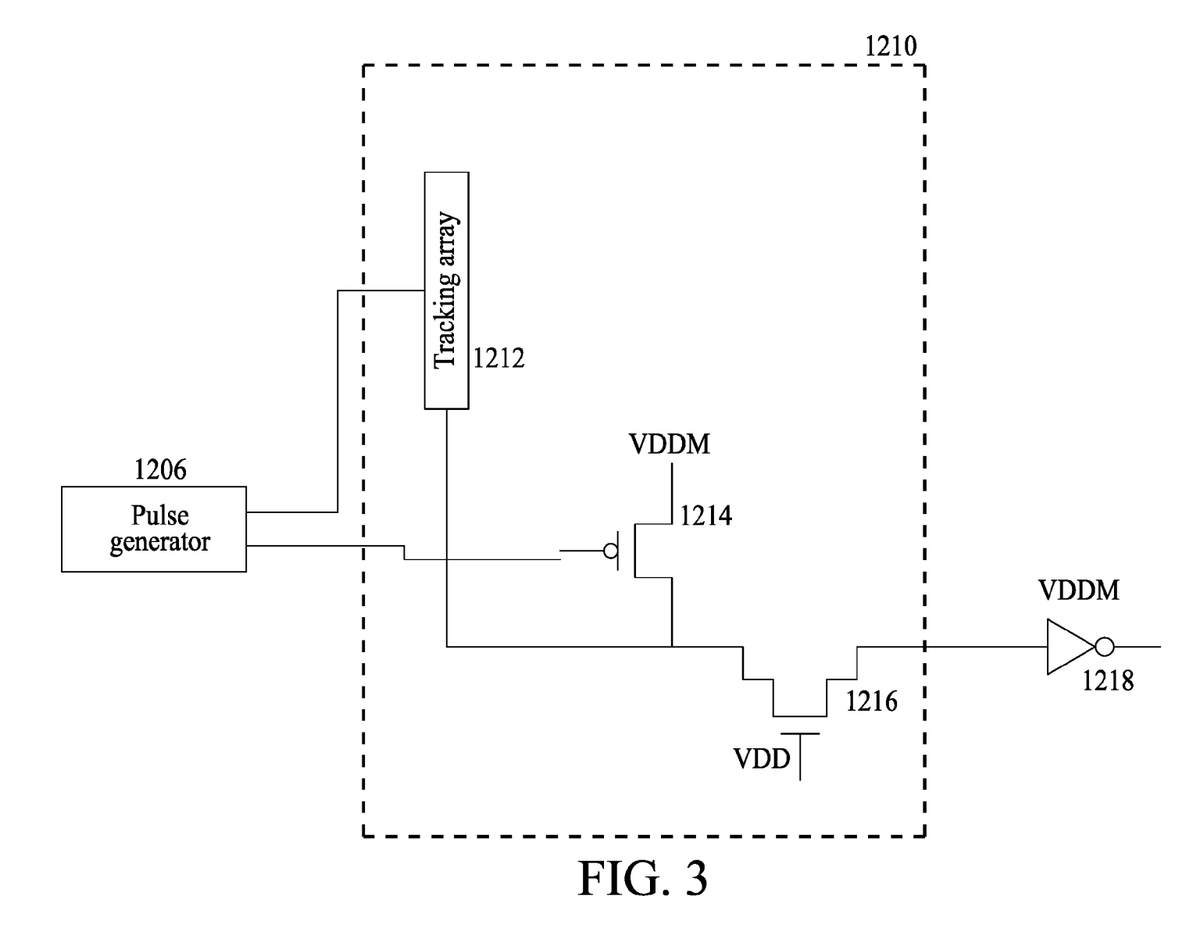
FIG. 3 is a schematic diagram illustrating a portion of a control circuit according to an exemplary embodiment of the present disclosure.

FIG. 3 is a schematic diagram illustrating a portion of the control circuit 120 according to an exemplary embodiment of the present disclosure. As shown in FIG. 3, the tracking path 1210 includes a tracking array 1212, a p-channel metal-oxide-semiconductor field-effect transistor (hereinafter called "PMOS" device) 1214 and an NMOS device 1216. By using an inverter 1218 that operates at the first voltage VDDM, an inverted output of the tracking path 1210 is coupled to the bit cells of the memory array 150 so as to allow a voltage level of the specified bit cell being reduced in response to an output width of the pulse generator 1206. As such, like the memory array 150, the pulse generator 1206, the tracking array 1212 and the PMOS device 1214 are configured to operate at the first voltage VDDM. The NMOS 1216 is used as a transmission gate coupled between the tracking array 1212 and the bit cells in the memory array 150. A gate of the NMOS 1216 is coupled to the second voltage VDD. Although the second voltage VDD is lower than the first voltage VDDM, the NMOS still can be turned on to allow signals to pass through.

Referring back to FIG. 2, at the upper left side, the word line driver circuits 140 include two word line drivers 1402 and 1404. At the lower right side of FIG. 2, the data paths 110 include a pair of data paths. The left data path includes a bit line pre-charger 1102 coupled to a write data path and a read data path. The write data path of the left data path includes a write column mux 1106, a write driver 1108 and a data in latch 1110. The read data path of the left data path includes a read column mux 1112, a sense amplifier 1114 and an output driver 1116. Similarly, the right data path includes a bit line pre-charger 1104 coupled to a write data path and a read data path. The write data path of the right data path includes a write column mux 1118, a write driver 1120 and a data in latch 1122. The read data path of the right data path includes a read column mux 1124, a sense amplifier 1126 and an output driver 1128.

The write driver 1108 is utilized to drive input data latched by the data in latch 1110 received from a CPU or another processor during a write operation, wherein the input data may be complimentary data. The input data requires to be written into a specified bit cell of the memory array 150 that is identified by the control circuit 120. Output signals of the write driver 1108 selectively pass through the corresponding write column mux 1106 in response to the decoding result of the word line column decoder 1204 of the control circuit 120. The output signals of the write driver 1108 are pre-charged via the bit line pre-charger 1102.

Figure 4:
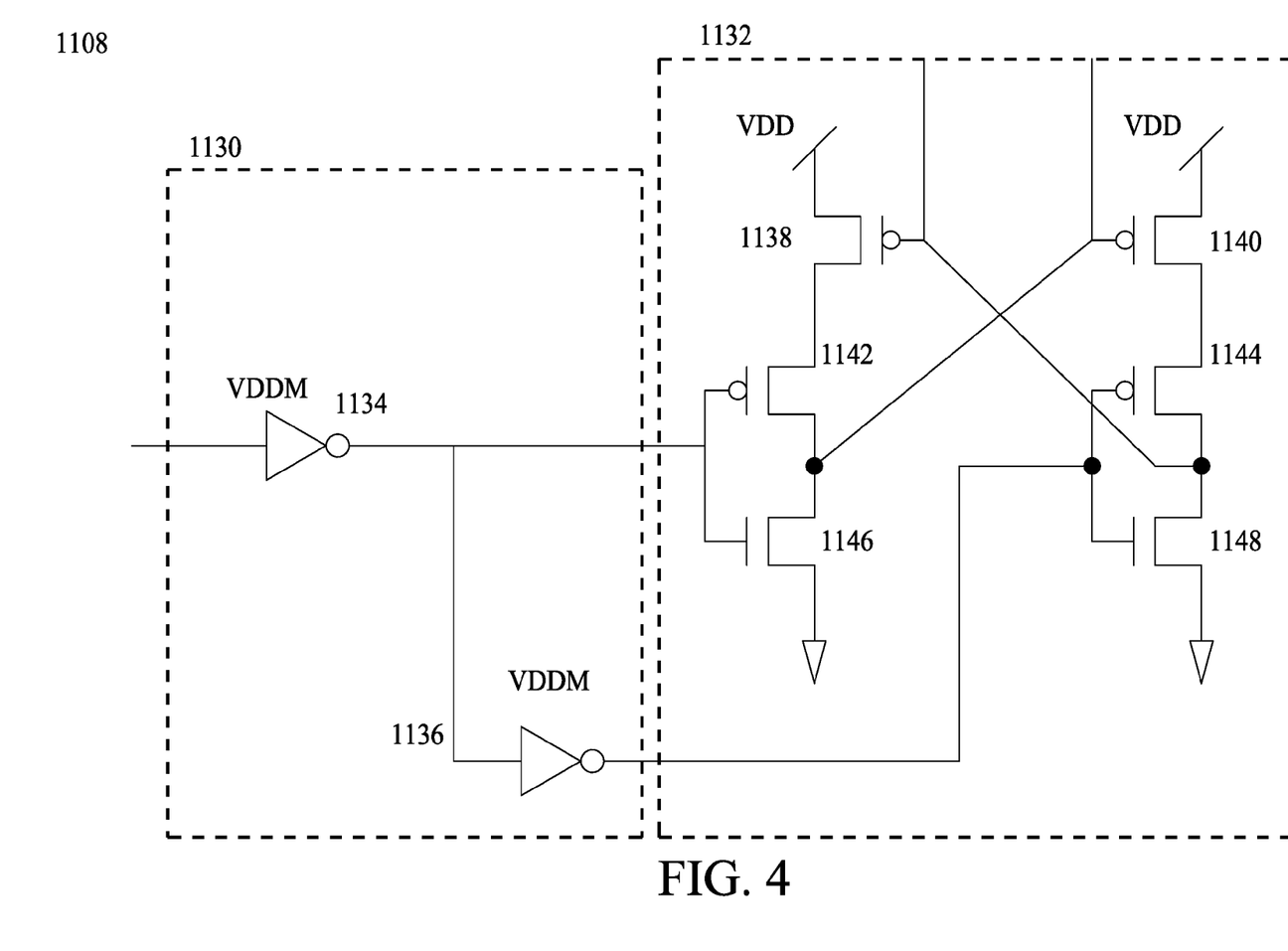
FIG. 4 is a schematic diagram illustrating a write driver according to an embodiment of the present disclosure.

The bit line pre-charger 1102 and the data in latch 1110 are configured to operate at the second voltage VDD, while the write driver 1108 is configured to operate at both the first voltage VDDM and the second voltage VDD. Please refer to FIG. 4. FIG. 4 is a schematic diagram illustrating the write driver 1108 according to an embodiment of the present disclosure. The write driver 1108 includes a write driver pre-stage 1130 and a write driver post-stage 1132. The write driver pre-stage 1130 includes inverters 1134 and 1136 both being configured to operate at the first voltage VDDM. The write driver pre-stage 1130 receives write data from the data in latch 1110 via a level shifter (not shown in FIG. 4). Since the data in latch 1110 and the write driver pre-stage 1130 operate in different voltage domains, the level shifter transfers the write data from the second voltage VDD domain to the first voltage VDDM domain.

The write driver post-stage 1132 includes cross-coupled PMOS devices 1138-1144 and NMOS devices 1146 and 1148. According to the hybrid dual rail memory power supply scheme, the write driver post-stage 1132 is configured to operate at the second voltage VDD to eliminate any DC current being introduced in.

Referring back to FIG. 2, the read data path of the left data path includes a read column mux 1112, a sense amplifier 1114 and an output driver 1116. During a read operation, a voltage difference develops across corresponding bit lines and is passed to the sense amplifier 1114 through the corresponding read column mux 1112. When a sufficient voltage differential is attained, the sense amplifier 1114 is turned on. The read column mux 1112, the sense amplifier 1114 and the output driver 1116 are configured to operate at the second voltage VDD, so that lever shifters can be omitted at an interface of the read data path. The right data path of the data path 110 is substantially the same as the left data path, and the details are omitted here for brevity.

Figure 5:
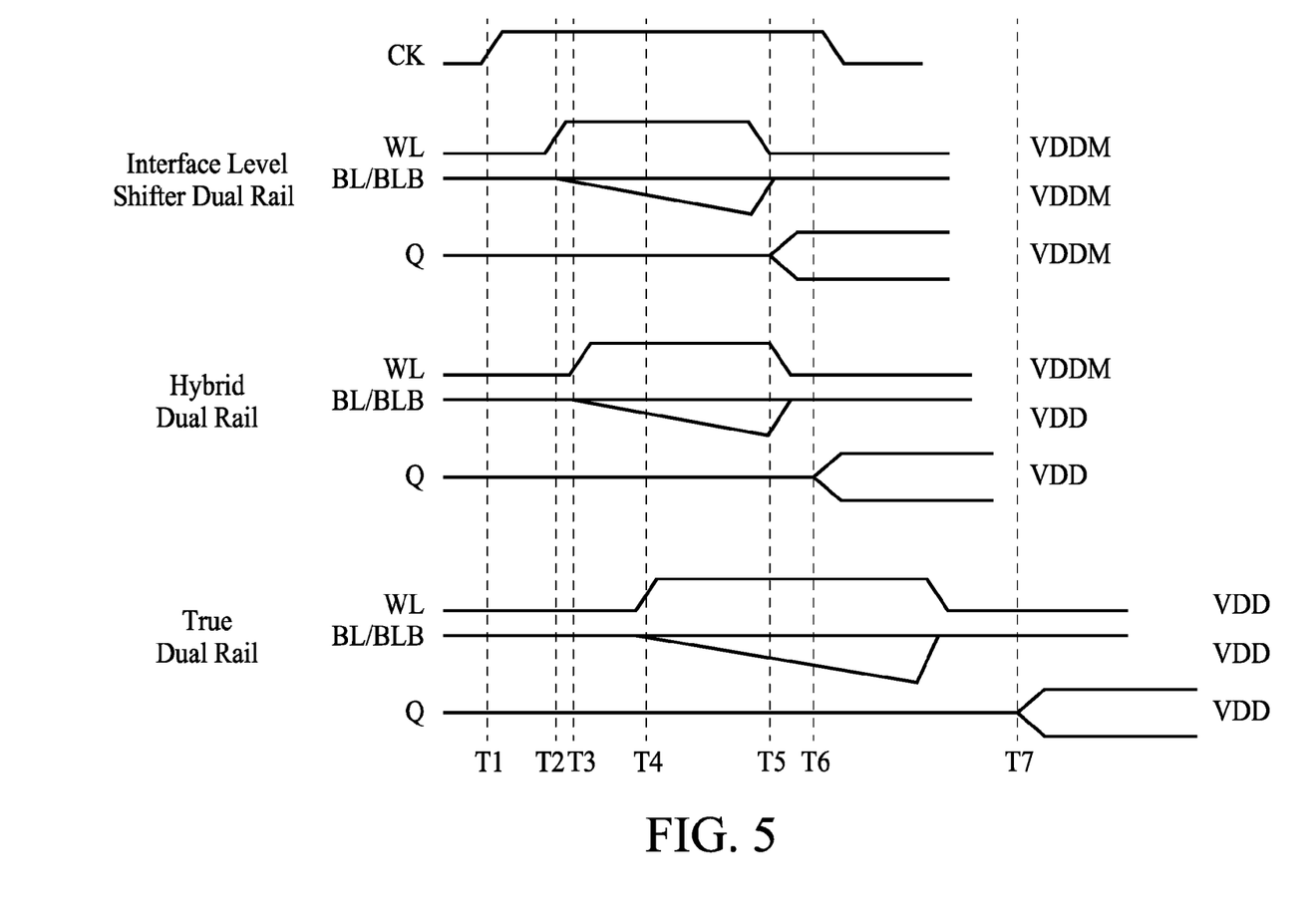
FIG. 5 is a timing diagram illustrating wave forms of the hybrid dual rail memory power supply scheme and existing dual rail memory power supply schemes during a read operation.

FIG. 5 is a timing diagram illustrating wave forms of the hybrid dual rail memory power supply scheme and existing dual rail memory power supply schemes during a read operation. As shown in FIG. 5, signals during a read operation with respect to three different schemes, i.e. the hybrid dual rail memory power supply scheme of the present disclosure, the interface level shifter dual rail memory power supply scheme and the true dual rail memory power supply scheme, are illustrated to facilitate comparison of timing sequences. A top most clock signal CK is used as a reference timing index for the three different power supply schemes. Each power supply scheme has a word line signal WL, a bit line signal BL and its complementary signal BLB, and a signal Q sensed by a sense amplifier.

As mentioned above, the memory macro employing the interface level shifter dual rail memory power supply scheme purely has a control circuit and read data paths operating in a voltage domain (e.g. the first voltage VDDM) the same as the memory arrays voltage domain; while the memory macro employing the true dual rail memory power supply scheme has a control circuit and a read data path operating in a lower voltage domain (e.g. the second voltage VDD) than the voltage domain (e.g. the first voltage VDDM) that the memory array operates in. As for the hybrid dual rail memory power supply scheme of the present disclosure, the control circuit 120 operates at both the first voltage VDDM and the second voltage VDD, and the read data path operates at the second voltage VDD.

As can be seen from FIG. 5, the interface level shifter dual rail memory power supply scheme has a fastest rising timing of the word line signal WL at time T2 after the assertion of the clock signal CK at time T1. The timing of rising of the word line signal WL of the hybrid dual rail memory power supply scheme at time T3 is slightly behind the interface level shifter dual rail memory power supply scheme due to the fact that the control circuit partially operates at the second voltage VDD which more or less affects the rising speed of the word line signal WL. The word line signals WL of the interface level shifter dual rail memory power supply scheme and the hybrid dual rail memory power supply scheme are both pulled up to the first voltage VDDM by the word line driver which operates at the first voltage VDDM; while in the true dual rail memory power supply scheme, the word line signals WL rises until attaining the second voltage VDD because the word line driver is configured to operate at the second voltage VDD. As a consequence, the timing of rising of the word line signal WL of the true dual rail memory power supply scheme at time T4 is much behind the interface level shifter dual rail memory power supply scheme and the hybrid dual rail memory power supply scheme as shown in the timing diagram. A width of the word line signal WL is also much longer than that of the other two power supply schemes in order to reserve a longer time for discharging the bit line BL or its complementary signal BLB.

For the interface level shifter dual rail memory power supply scheme, the bit lines BL and its complementary signal BLB are previously pre-charged to the first voltage VDDM; while in the hybrid dual rail memory power supply scheme and the true dual rail memory power supply scheme, the bit lines BL and its complementary signal BLB are previously pre-charged to the second voltage VDD. When the word line WL rises after the read operation begins, one of the bit line BL and its complementary signal BLB is discharged slightly and as can be seen in the timing diagram, the voltages on the bit lines BL and its complementary signal BLB begin to spread apart. A differential bit line voltage is developed between the bit line BL and its complementary signal BLB; this differential voltage may then be sensed and amplified by a sense amplifier coupled to the pair of bit lines as mentioned in the previous paragraphs, and a read data from the sense amplifier is then output from the memory array.

In the interface level shifter dual rail memory power supply scheme, the differential bit line voltage is successfully sensed by the sense amplifier at time T5. The sensing of the hybrid dual rail memory power supply scheme is completed at time T6 and slightly behind the interface level shifter dual rail memory power supply scheme; while the sensing of the true dual rail memory power supply scheme is completed at time T7, which is much slower than the sensing speed of the interface level shifter dual rail memory power supply scheme and the hybrid dual rail memory power supply scheme. As can be seen from the timing diagram, the sensing speed of the hybrid dual rail memory power supply scheme is approximately between the sensing speed of the interface level shifter dual rail memory power supply scheme and the true dual rail memory power supply scheme. Specifically, the sensing speed performance of the hybrid dual rail memory power supply scheme is relatively closer to the interface level shifter dual rail memory power supply scheme.

Figure 6:
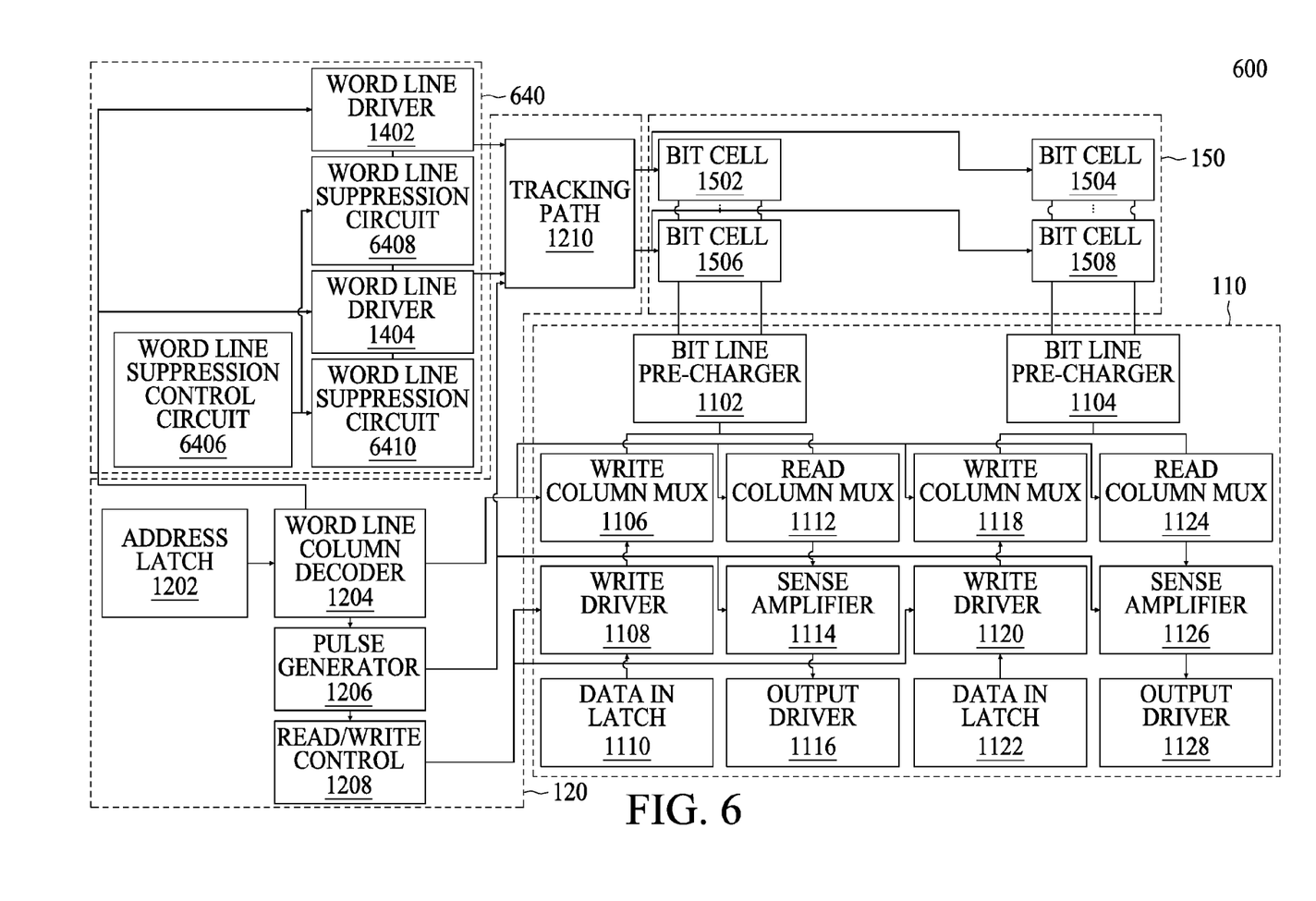
FIG. 6 is a block diagram conceptually illustrating a hybrid dual rail memory power supply scheme with a suppressed word line voltage for a memory macro according to an exemplary embodiment of the present disclosure.

When the peripheral voltage (i.e. the second voltage VDD) keeps cutting down, the gap between the memory array voltage (i.e. the first voltage VDDM) and the peripheral voltage is widening. Such a gap may lead to incorrect functionality during a read operation, such as read/write disturbance. In view of the issue, various assistance mechanisms have been developed, seeking to assist individual memory cells in operating correctly when write and read operations are performed on those cells. In some embodiments, techniques for implementing a suppressed word line voltage may be included in the memory macro 100. FIG. 6 is a block diagram conceptually illustrating a hybrid dual rail memory power supply scheme with a suppressed word line voltage for a memory macro 600 according to an exemplary embodiment of the present disclosure. The memory macro 600 is the same as the memory macro 100 except a word line driver circuit 640. In the word line driver circuit 640, a word line suppression control circuit 6406, a word line suppression circuit 6408 and word line suppression circuit 6410 are used to adjust a word line voltage driven by the word line drivers 1402 and 1404 from the first voltage VDDM to a suppressed voltage level which is lower than the first voltage VDDM. In some embodiments, the suppressed voltage is lower than the first voltage VDDM and higher than the second voltage VDD.

Figure 7:
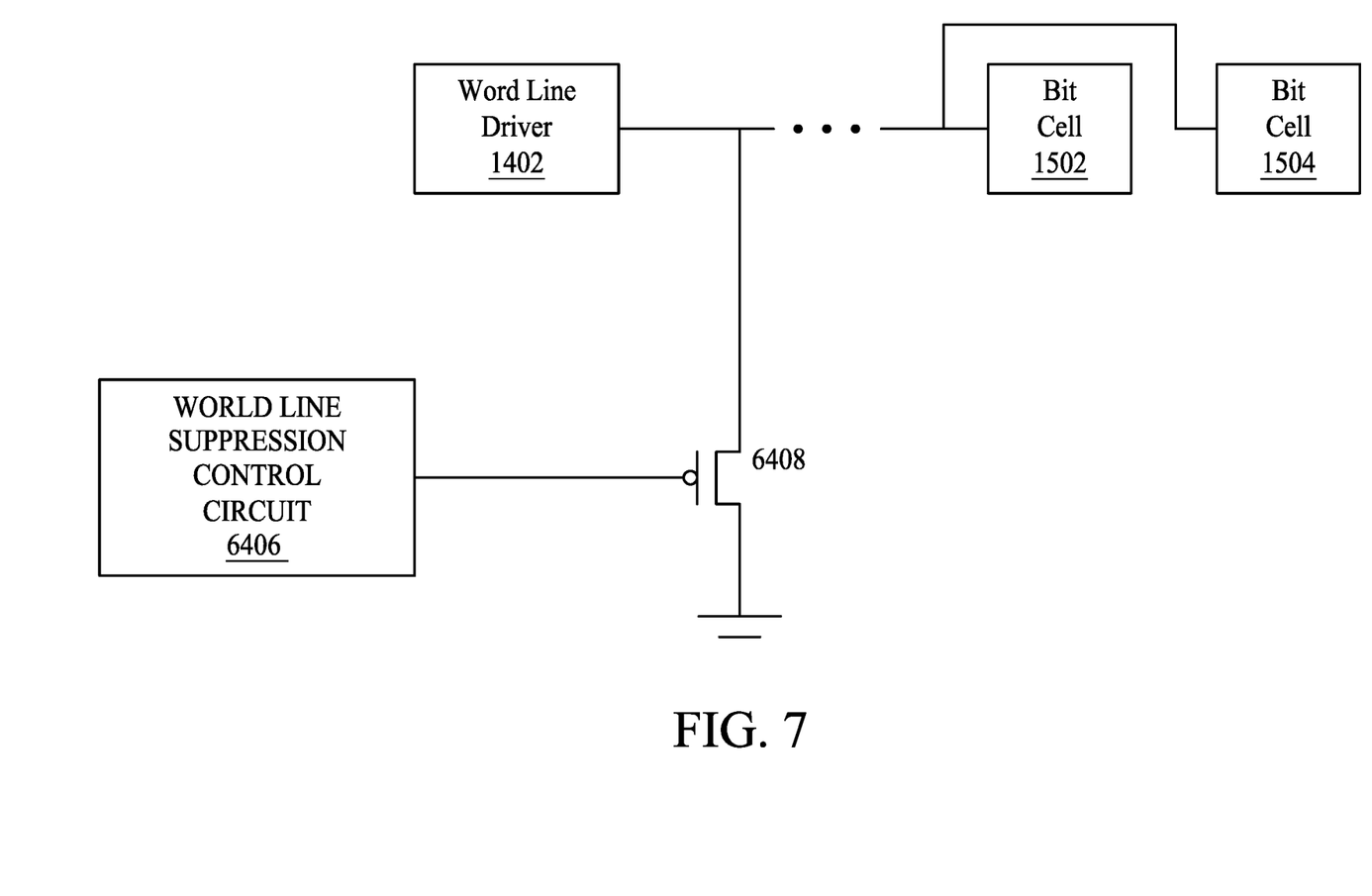
FIG. 7 is a schematic diagram illustrating the word line suppression circuit according to an embodiment of the present disclosure.
Figure 8:
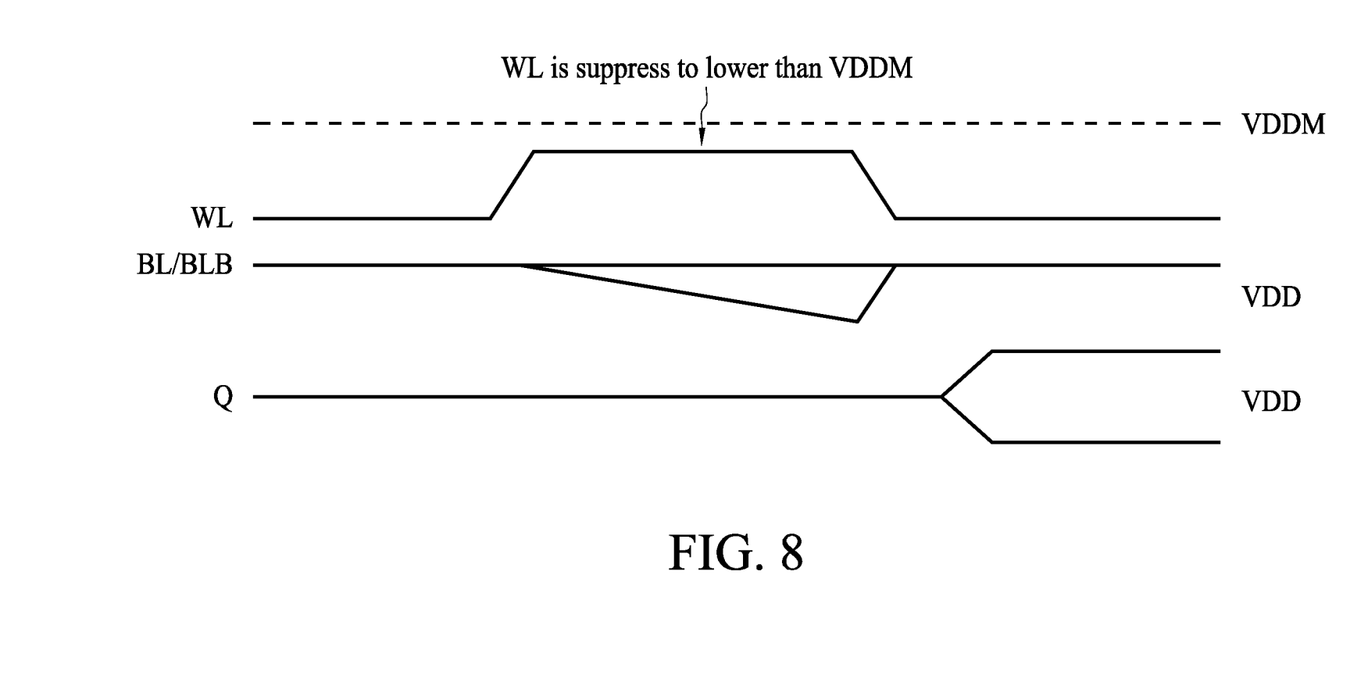
FIG. 8 is a timing diagram illustrating wave forms of the hybrid dual rail memory power supply scheme with a suppressed word line voltage during a read operation.

FIG. 7 is a schematic diagram illustrating the word line suppression circuit according to an embodiment of the present disclosure. As can be seen in FIG. 7, the word line suppression circuits 6408 is a PMOS device having a gate terminal coupled to the word line suppression control circuit 6406 and a source terminal coupled to the word line. In some embodiments, the word line suppression circuits 6408 may be implemented by an NMOS device. FIG. 8 is a timing diagram illustrating wave forms of the hybrid dual rail memory power supply scheme with a suppressed word line voltage during a read operation.

Figure 9:
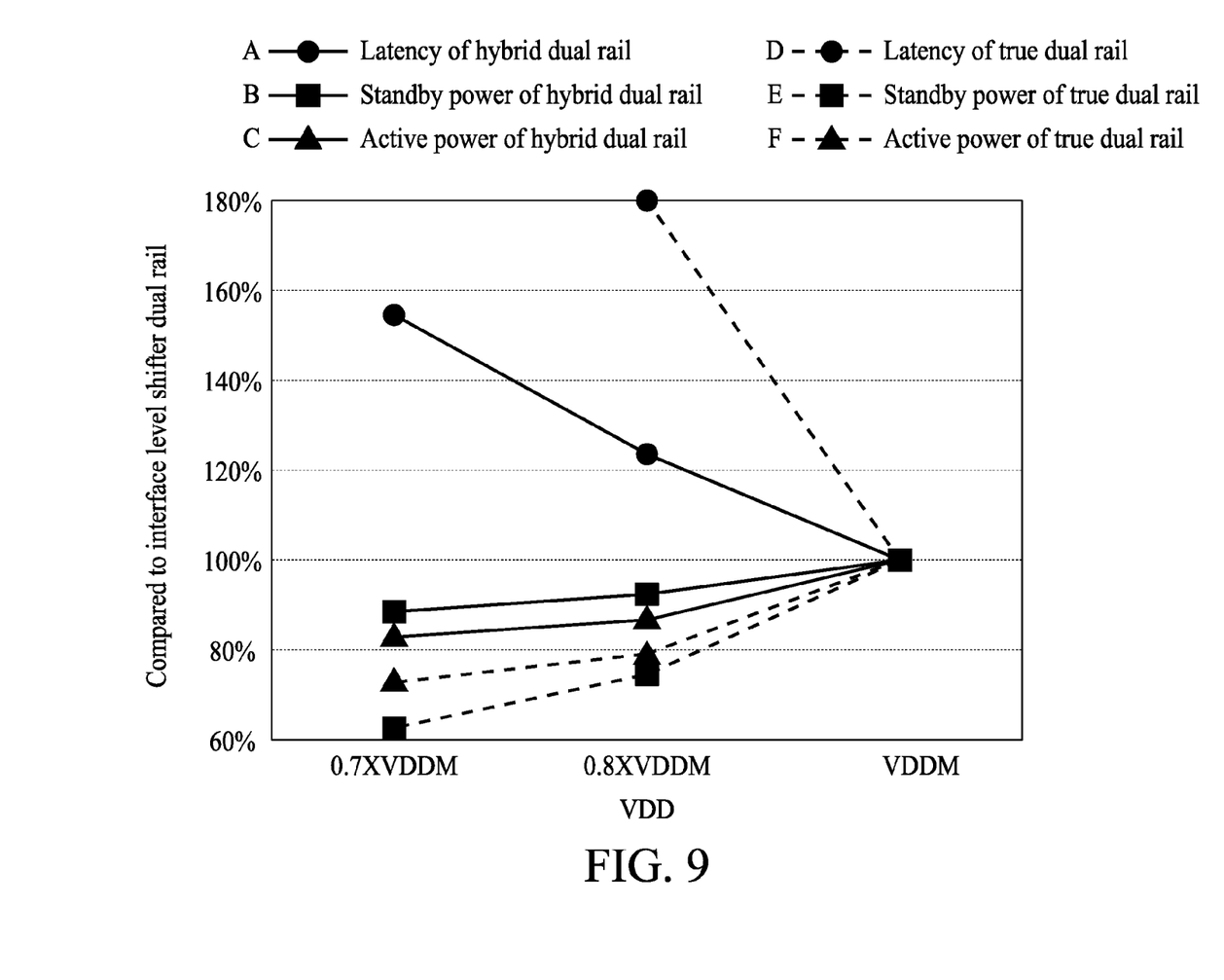
FIG. 9 is a diagram illustrating measured curves of the hybrid power supply scheme and existing power supply schemes with respect to performance of speed and power consumption by different configurations of the second voltage.

FIG. 9 is a diagram illustrating measured curves of the hybrid power supply scheme and existing power supply schemes with respect to performance of speed and power consumption by different configurations of the second voltage VDD. Referring to FIG. 9, the x-axis represents a quantized comparison result with the interface level shifter dual rail memory scheme; and the y-axis represents the second voltage VDD. An upper curve D of FIG. 9 relates to a read latency of the true dual rail memory power supply scheme. As can be seen in the diagram, when the second voltage VDD equals to the first voltage VDDM, a read latency of the true dual rail memory power supply scheme is substantially the same as the interface level shifter dual rail memory power supply scheme. However, when the second voltage VDD reaches 0.8 VDDM, a read latency of the true dual rail memory power supply scheme is increased to about 180% of a read latency of the interface level shifter dual rail memory power supply scheme.

Please note that it should be apparent to the person of ordinary skill in the art that variations may exist in the first voltage VDDM and/or the second voltage VDD due to some non-ideal factors such as the IR drop, the thermal effect, or process variations. Practically, each of the first voltage VDDM and the second voltage VDD may be a substantial voltage value having a variation range, for example, ±10%. However, this is not a limitation of the present disclosure.

Below the upper curve D, from top to bottom, the curve A of FIG. 9 relates to a read latency of the hybrid dual rail memory power supply scheme; curve B relates to a standby power of the hybrid dual rail memory power supply scheme; curve C relates to an active power of the hybrid dual rail memory power supply scheme; curve F relates to an active power of the true dual rail memory power supply scheme; and curve E relates to a standby power of the true dual rail memory power supply scheme. As can be seen from the measured curves, the hybrid dual rail memory power supply scheme has a better performance in terms of speed and power consumption as compared to the true dual rail memory power supply scheme.

In some embodiments, the hybrid dual rail memory power supply scheme that can be beneficially applied to a variety of memory arrangements and types, such as a single-port SRAM, a two-port SRAM, a dual-port SRAM and a multi-port SRAM. The bit cells in the memory array of the memory macro may be 8-T (8 transistors) bit cells. However, it will become apparent to those skilled in the art given the teachings herein that numerous modifications can be made to the embodiments shown that are within the scope of the present invention.

Some embodiments of the present disclosure provide a dual rail memory operable at a first voltage and a second voltage, and the dual rail memory includes: a memory array operates at the first voltage; a word line driver circuit configured to drive a word line of the memory array to the first voltage; a data path configured to transmit an input data signal or an output data signal; and a control circuit configured to generate control signals to the memory array, the word line driver circuit and the data path; wherein the data path and the control circuit are configured to operate at both the first and second voltages.

In some embodiments of the present disclosure, the first voltage is higher than the second voltage.

In some embodiments of the present disclosure, the data path includes a write circuit for transmitting the input data signal, a read circuit for transmitting the output data signal, and a bit line pre-charger.

In some embodiments of the present disclosure, the write circuit includes a data in latch, a write driver and a write column mux.

In some embodiments of the present disclosure, the data in latch is configured to latch the input data signal referenced to the second voltage.

In some embodiments of the present disclosure, the write driver is configured to drive the latched input data, wherein a pre-stage of the write driver is configured to operate at the second voltage, and a post-stage of the write driver is configured to operate at the first voltage.

In some embodiments of the present disclosure, the bit line pre-charger pre-charges a bit line and a complementary bit line corresponding to a bit cell of the memory array to the second voltage.

In some embodiments of the present disclosure, the read circuit includes a read column mux, a sense amplifier and an output driver.

In some embodiments of the present disclosure, the sense amplifier is configured to operate at the second voltage.

In some embodiments of the present disclosure, the output driver is configured to operate at the second voltage.

Some embodiments of the present disclosure provide a memory macro including: a plurality of memory arrays configured to operate at a first voltage; a read path configured to operate at a second voltage; a write path configured to operate at both the first and second voltages; a word line driver circuit configured to drive a plurality of word lines corresponding to the plurality of memory arrays to a third voltage; and a control circuit configured to generate control signals to the memory arrays, the read path, the write path and the word line drivers; wherein the read path is configured to operate at the second voltage, the write path and the control circuit are configured to operate at both the first and second voltages.

In some embodiments of the present disclosure, the word line driver circuit includes a plurality of word line drivers and a word line suppression circuit.

In some embodiments of the present disclosure, the word line suppression circuit is configured to suppress a driving voltage level of the plurality of word line drivers to the third voltage, and the third voltage is lower than the first voltage.

In some embodiments of the present disclosure, the third voltage is higher than the second voltage.

In some embodiments of the present disclosure, the control circuit includes an address latch, a word line column decoder, a pulse generator, a read/write control, and a tracking path.

In some embodiments of the present disclosure, the address latch, the word line column decoder, the pulse generator and the read/write control are configured to operate at the first voltage.

In some embodiments of the present disclosure, the tracking path includes a tracking array and a transmission gate, and the tracking array is configured to operate at the first voltage and the transmission gate is configured to operate at the second voltage.

Some embodiments of the present disclosure provide a hybrid power supply method for configuring a dual rail memory to operate at a first voltage and a second voltage, wherein a memory array of the dual rail memory is operable at the first voltage, and the method includes: driving a word line of the memory array to the first voltage; and reading an output data stored in the memory array via a read circuit operable at the second voltage.

In some embodiments of the present disclosure, the first voltage is higher than the second voltage.

In some embodiments of the present disclosure, the method further includes writing an input data into the memory array via a write circuit operable at both the first and second voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual rail memory operable at a first voltage and a second voltage, the dual rail memory comprising:
   a memory array operates at the first voltage;
   a word line driver circuit configured to drive a word line of the memory array to the first voltage;
   a data path configured to transmit an input data signal or an output data signal; and
   a control circuit configured to generate control signals to the memory array, the word line driver circuit and the data path,
   wherein the data path and the control circuit are configured to operate at both the first and second voltages;
   wherein the data path includes a write driver configured to drive the input data signal, and
      a pre-stage of the write driver is configured to operate at the second voltage, and a post-stage of the write driver is configured to operate at the first voltage;
      wherein the second voltage is different from the first voltage,
      and wherein a read latency of the dual rail memory varies according to a level of the second voltage in relation to a level of the first voltage.

2. The dual rail memory of claim 1, wherein the first voltage is higher than the second voltage.

3. The dual rail memory of claim 1, wherein the data path comprises a write circuit for transmitting the input data signal, a read circuit for transmitting the output data signal, and a bit line pre-charger.

4. The dual rail memory of claim 3, wherein the write circuit comprises a data in latch, the write driver and a write column mux.

5. The dual rail memory of claim 4, wherein the data in latch is configured to latch the input data signal referenced to the second voltage.

6. The dual rail memory of claim 3, wherein the bit line pre-charger pre-charges a bit line and a complementary bit line corresponding to a bit cell of the memory array to the second voltage.

7. The dual rail memory of claim 3, wherein the read circuit comprises a read column mux, a sense amplifier and an output driver.

8. The dual rail memory of claim 7, wherein the sense amplifier is configured to operate at the second voltage.

9. The dual rail memory of claim 7, wherein the output driver is configured to operate at the second voltage.

10. A memory macro, comprising:
a plurality of memory arrays configured to operate at a first voltage;
a read path configured to operate at a second voltage;
a write path configured to operate at both the first and second voltages;
a word line driver circuit configured to drive a plurality of word lines corresponding to the plurality of memory arrays to a third voltage; and
a control circuit configured to generate control signals to the memory arrays, the read path, the write path and the word line drivers,
wherein the read path is configured to operate at the second voltage, the write path and the control circuit are configured to operate at both the first and second voltages;
wherein the control circuit comprises an address latch, a word line column decoder, a pulse generator, a read/write control which are configured to operate at the first voltage;
wherein the first voltage, the second voltage, and the third voltage are different from each other.

11. The memory macro of claim 10, wherein the word line driver circuit comprises a plurality of word line drivers and a word line suppression circuit.

12. The memory macro of claim 11, wherein the word line suppression circuit is configured to suppress a driving voltage level of the plurality of word line drivers to the third voltage, and the third voltage is lower than the first voltage.

13. The memory macro of claim 12, wherein the third voltage is higher than the second voltage.

14. The memory macro of claim 10, wherein the control circuit further comprises a tracking path.

15. The memory macro of claim 14, wherein the tracking path comprises a tracking array and a transmission gate, and the tracking array is configured to operate at the first voltage and the transmission gate is configured to operate at the second voltage.

16. A hybrid power supply method for configuring a dual rail memory to operate at a first voltage and a second voltage, wherein a memory array of the dual rail memory is operable at the first voltage, the method comprising:
driving a word line of the memory array to the first voltage; and
reading an output data stored in the memory array via a read circuit operable at the second voltage;
writing an input data signal into the memory array via a write circuit operable at both the first and second voltage, comprising:
latching the input data signal referenced to the second voltage; and
driving the latched input data by using a pre-stage operating at the second voltage and using a post-stage operating at the first voltage;
wherein the second voltage is different from the first voltage, and
wherein a read latency of the dual rail memory varies according to a level of the second voltage in relation to a level of the first voltage.

17. The method of claim 16, wherein the first voltage is higher than the second voltage.

18. The method of claim 16, further comprising:
pre-charging a bit line and a complementary bit line corresponding to a bit cell of the memory array to the second voltage.

19. The method of claim 16, wherein reading the output data stored in the memory array via the read circuit operable at the second voltage comprises:
configuring a sense amplifier to operate at the second voltage; and
configuring an output driver to operate at the second voltage.

* * * * *